United States Patent [19]
Liu et al.

[11] Patent Number: 6,078,099
[45] Date of Patent: Jun. 20, 2000

[54] LEAD FRAME STRUCTURE FOR PREVENTING THE WARPING OF SEMICONDUCTOR PACKAGE BODY

[75] Inventors: Wen-Chun Liu, Pingtung Hsien; Jung-Jie Liou, Kaohsiung; Chih-Kung Huang, Hsinchu, all of Taiwan

[73] Assignee: Walsin Advanced Electronics LTD, Hsinchu, Taiwan

[21] Appl. No.: 09/249,881

[22] Filed: Feb. 16, 1999

[30] Foreign Application Priority Data

Nov. 20, 1998 [TW] Taiwan .................................. 87119248

[51] Int. Cl.⁷ .................................................. H01L 23/495
[52] U.S. Cl. ............................................. 257/676; 257/666
[58] Field of Search ..................................... 257/666, 676

[56] References Cited

U.S. PATENT DOCUMENTS 5,172,214  12/1992  Casto .
5,291,059   3/1994  Ishitsuka et al. .

FOREIGN PATENT DOCUMENTS 1-25448   1/1989  Japan .
2-65264   3/1990  Japan .
2-137251  5/1990  Japan .
6-21307   1/1994  Japan .

*Primary Examiner*—Sheila V. Clark
*Attorney, Agent, or Firm*—Jiawei Huang; J.C. Patents

[57] ABSTRACT

A lead frame structure can prevent the warping of a semiconductor package body. The lead frame has a downset die pad and upset internal leads so that packaging material can be evenly distributed both above and below the lead frame.

28 Claims, 5 Drawing Sheets

LEAD FRAME STRUCTURE FOR PREVENTING THE WARPING OF SEMICONDUCTOR PACKAGE BODY

CROSS-REFERENCE TO RELATED APPLICATION

This application claims the priority benefit of Taiwan application serial no. 87119248, filed Nov. 20, 1998, the full disclosure of which is incorporated herein by reference.

BACKGROUND OF THE INVENTION

1. Field of Invention

The present invention relates to a lead frame structure. More particularly, the present invention relates to a lead frame structure capable of preventing semiconductor package body from warping.

2. Description of Related Art

In general, the manufacturing of integrated circuit (IC) can be divided into three separate stages: fabricating silicon wafers, forming integrated circuit on the silicon chips and packing the integrated circuit (IC) chips. Packaging of the IC chip is the final step in the production of IC products. In packaging an IC chip, the lead frame serves as a carrier for the silicon chip as well as an intermediate element linking the silicon chip with external printed circuit board (PCB).

FIG. 1 is a schematic, top view showing a typical lead frame structure. As shown in FIG. 1, the lead frame has a flat, sheet-like structure. Each lead frame can be divided into two sections, namely, a planar section and leads section. The planar section includes a silicon chip carrier commonly known as a bar pad or die pad 12. The lead section can be further subdivided into internal lead sections 14, lead shoulders 16 and external lead sections 18. The lead frame can also be divided into a package area 22 (the region enclosed by larger, dotted rectangle), also known as an IC packaging area and external leads region. The packaging area 22 further includes a bonding area 20 or coin area within. The bonding area 20 is an area where metallic wires are bonded. The internal lead sections 14 that are within the coin area 20 are often referred to as coin lead tips 24. Each coin lead tip 24 serves as a base for fixing a conductive wire extending from the silicon chip to the leads.

Furthermore, to facilitate automation of production, the lead frame further includes two side rails 26 for connecting with individual lead frames. Pilot holes 28 are also bored near the centerline of the side rails 26 for aligning the lead frame during assembly. Two tie bars 30 attached the die pad 12 to side rail 26. In addition, dam bars 32 connect all the lead shoulders 16 to the side rails 26. Besides holding all the leads in position while transfer molding is carried out, the dam bars 32 are used to prevent plastic compound from leaking out of the package.

Conventional method of packaging a semiconductor IC chip includes the steps of placing a silicon chip on the die pad 12, and then fixing the chip onto the die pad 12 with epoxy. Subsequently, the bonding pads of the silicon chip and the coin lead tips 24 of the leads 14 are electrically connected by attaching gold or aluminum wires in a bonding operation. Thereafter, the packaging area 22 is completely enclosed using an insulating material. Finally, the dam bars 32 are trimmed and the external leads are formed to obtain a complete IC package.

However, the original lead frame design can affect the quality of final IC package. For example, improper design of lead frame can lead to a high level of warping in the IC package body. FIGS. 2A and 2B are two, schematic, cross-sectional views showing two possible mode of warping for an IC package. The package body 40 in FIG. 2A warps up while the package body 44 in FIG. 2B warps down. Both types of warping will lead to immense difficulties in soldering their respective leads 42 and 46 onto a printed circuit board using conventional surface mounting technique (SMT).

In light of the foregoing, there is a need to provide an improved lead frame structure capable of preventing the warping of semiconductor package body.

SUMMARY OF THE INVENTION

Accordingly, the purpose of the present invention is to provide a lead frame structure capable of improving the degree of warping in semiconductor package body.

To achieve these and other advantages and in accordance with the purpose of the invention, as embodied and broadly described herein, the invention provides a lead frame structure. The lead frame has a downset die paddle, whereas all its internal leads are above the lead frame surface. Therefore, when the lead frame in the packaging area is sealed, packaging material can spread evenly to areas above and below the lead frame. Hence, warping of the package body due to thermal stress is greatly reduced.

According to a second embodiment, the invention provides a lead frame structure. The lead frame has a downset die paddle as well as internal leads. Therefore, when the lead frame in the packaging area is sealed, the packaging material can spread evenly to areas above and below the lead frame. Hence, warping of the package body due to thermal stress is greatly reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
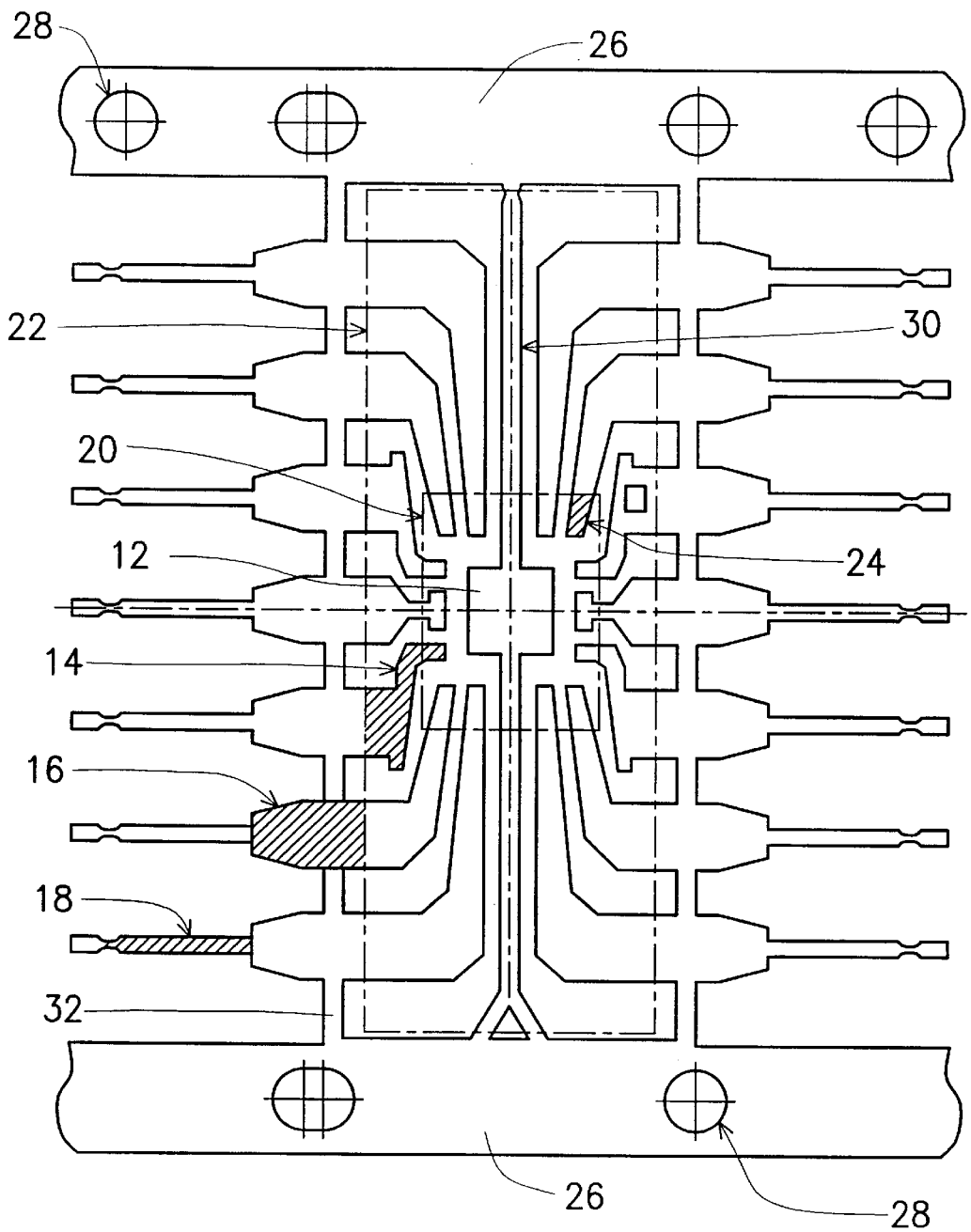
FIG. 1 is a schematic, top view showing a typical lead frame structure.

Reference will now be made in detail to the present preferred embodiments of the invention, examples of which are illustrated in the accompanying drawings. Wherever possible, the same reference numbers are used in the drawings and the description to refer to the same or like parts.

Figure 3:
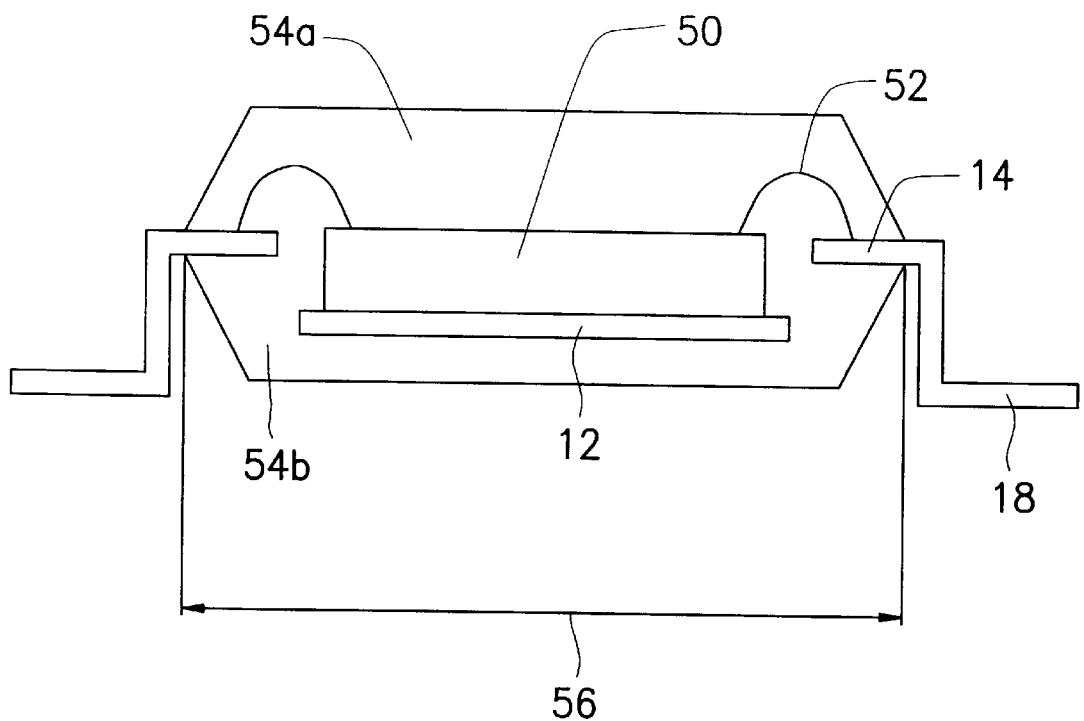
FIG. 3 is a schematic, cross-sectional view showing a conventional semiconductor IC package.

FIG. 3 is a schematic, cross-sectional view showing a conventional semiconductor IC package. As shown in FIG. 3, the lead frame serves as a carrier for a silicon chip. The lead frame has a downset die paddle 12 on which the chip 50 is placed. This lead frame design can considerably reduce the package thickness. Since the die paddle 12 is held by the tie bars 30, the tie bars 30 also bend down as well. The bonding pads (not shown in FIG. 3) above the chip 50 are connected to the internal leads 14 by gold wires 52 laid down in bonding operations. The entire packaging area of the lead frame is then sealed off by epoxy resin 54a above the lead frame and epoxy resin 54b below the lead frame. The only exposed parts are the external leads 18.

For a downset die paddle 12 type of lead frame as shown in FIG. 3, volume of epoxy resin injected into the upper part of the lead frame and die paddle will be greater than the epoxy resin injected into the lower part of the lead frame and die paddle. Because the upper and the lower part of the lead frame contain unequal volumes of epoxy resin, and the thermal expansion coefficients for epoxy resin, silicon chip and die paddle are all different, thermal stress is created. Hence, the package body may warp leading to package reliability problems. The package body warping will be all the more serious for a thin small outline package (TSOP) as well as a package body (conventional type-I package), whose distance of separation 56 between external leads 18 emerging from different sides of the package is great. The TSOP and type-1 packages are most often used for packaging semiconductor products such as flash memory, erasable programmable ROM (EPROM) or static random access memory (SRAM).

Figure 2A:
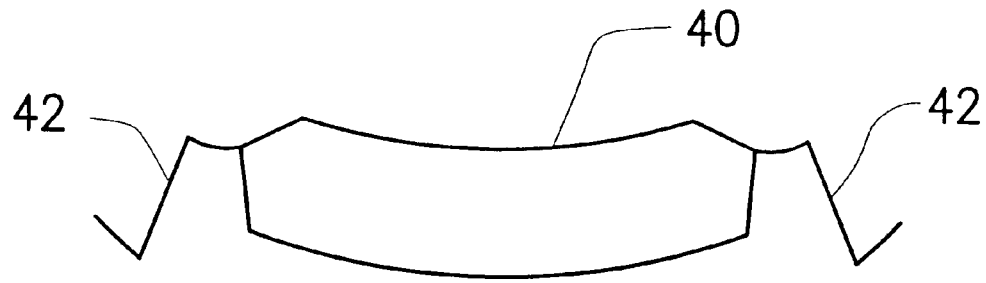
FIGS. 2A and 2B are two, schematic, cross-sectional views showing two possible modes of warping for an IC package.
Figure 2B:
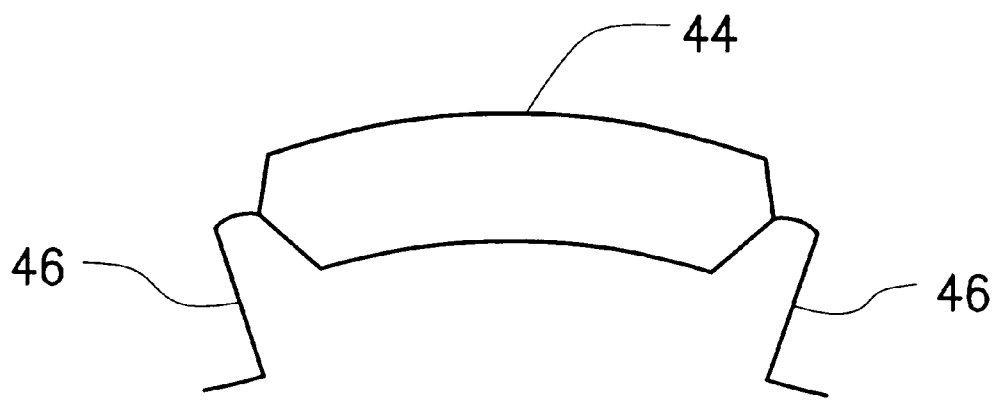

It has been found that lead frames made from different materials warps the package body somewhat differently. Most epoxy resin has a thermal expansion coefficient of between 3.7 to 3.8 while the silicon has a thermal expansion coefficient of around 4.1. If alloy such as A42 (having a thermal expansion coefficient of about 4.3) is used to form the lead frame, the package body will warp up just like the one shown in FIG. 2A. On the other hand, if copper such as C7025 (having a thermal expansion coefficient of between 17.2 to 17.6) is used to form the lead frame, the package body will warp down just like the one shown in FIG. 2B. Both types of lead frame will cause warping of the package body and hence will affect the quality of the final product.

Figure 4A:
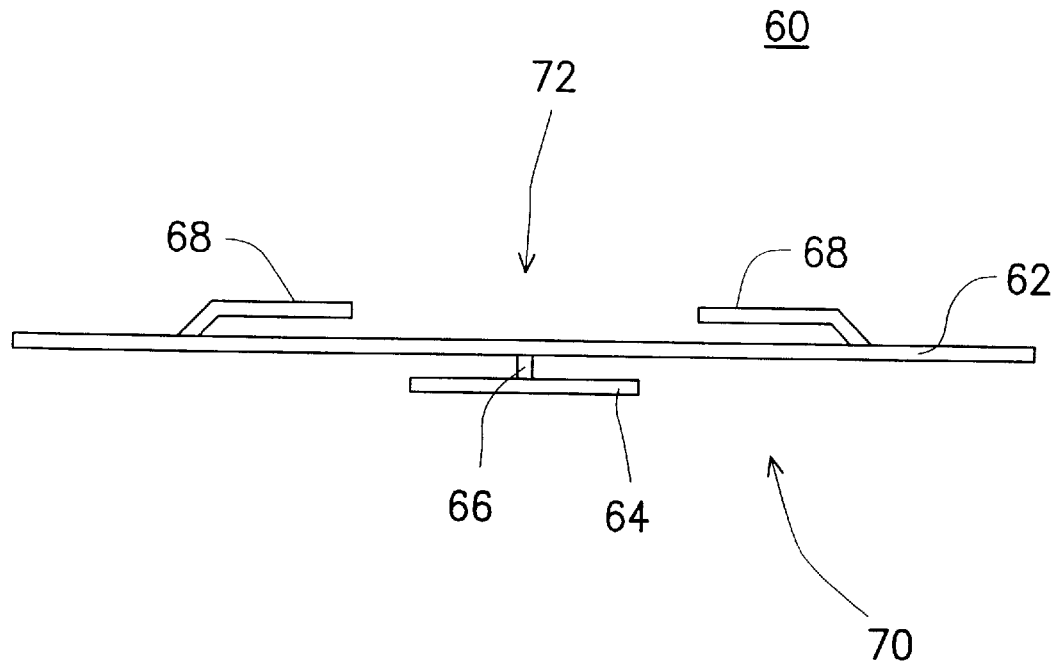
FIG. 4A is a schematic, side view showing a lead frame structure according to a first preferred embodiment of this invention.

FIG. 4A is a side view showing a lead frame structure according to a first preferred embodiment of this invention. In FIG. 4A, the lead frame 60 is made of alloy. The lead frame comprises of a base sheet 62 that includes two side rails (similar to label 26 in FIG. 1), dam bars (similar to label 32 in FIG. 1), lead shoulders (similar to label 16 in FIG. 1) and external leads (similar to label 18 in FIG. 1). A die paddle 64 is below base sheet 62 at the lower side 70 of the base sheet 62, such that the two surfaces are parallel to each other. Since the die paddle 64 is below the base sheet 62, tie bars 66 used to connect the die paddle 64 to both side rails also bend downwards.

On the other hand, all the internal leads 68 bend upward above the base sheet 62. In other words, all the internal leads are on the upper side 72. Moreover, end sections of the internal leads 68 form a flat surface that are parallel with the base sheet 62. Such lead frame configuration can reduce the package body warping in the subsequent 15 transfer molding operation.

Figure 4B:
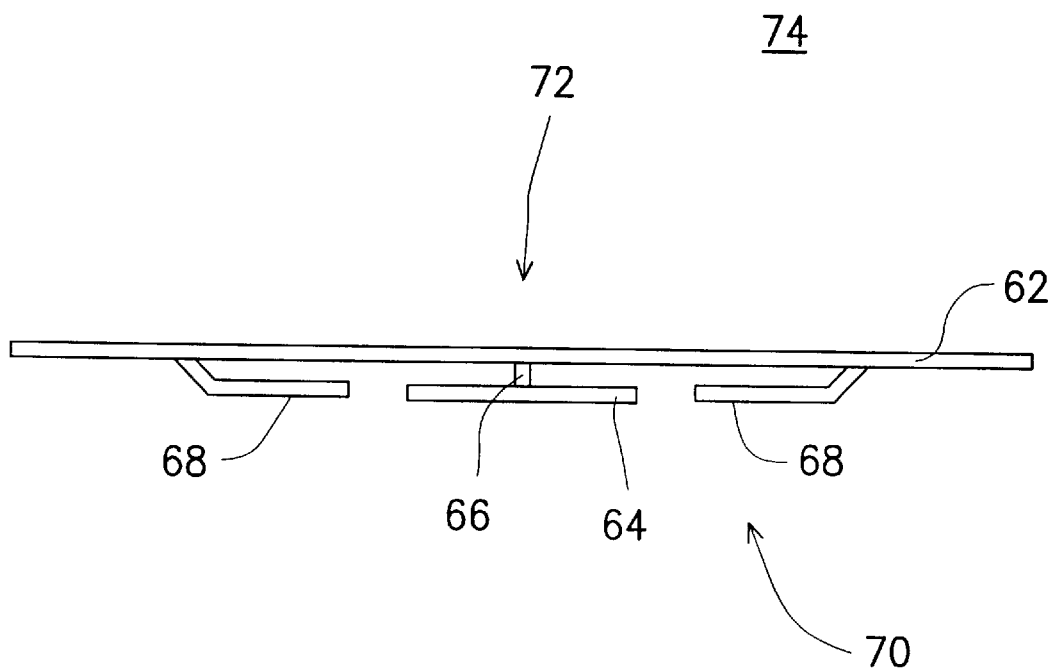
FIG. 4B is a schematic, side view showing a lead frame structure according to a second preferred embodiment of this invention.

FIG. 4B is a side view showing a lead frame structure according to a second preferred embodiment of this invention. In FIG. 4B, the lead frame 74 is made from copper. The lead frame comprises a base sheet 62 that includes two side rails (similar to label 26 in FIG. 1), dam bars (similar to label 32 in FIG. 1), lead shoulders (similar to label 16 in FIG. 1) and external leads (similar to label 18 in FIG. 1). The die paddle 64 is below the base sheet 62 at the lower side 70 of the base sheet 62 such that the two surfaces are parallel to each other.

Since the die paddle 64 is below the base sheet 62, the tie bars 66 also bend downwards. Similarly, all the internal leads 68 bend down below the base sheet 62. In other words, all the internal leads are on the lower side 70. Moreover, end sections of the internal leads 68 form a flat surface that parallel the base sheet 62. Such a lead frame configuration can again reduce the warping of package body in the subsequent tranfer molding operation.

Figure 5A:
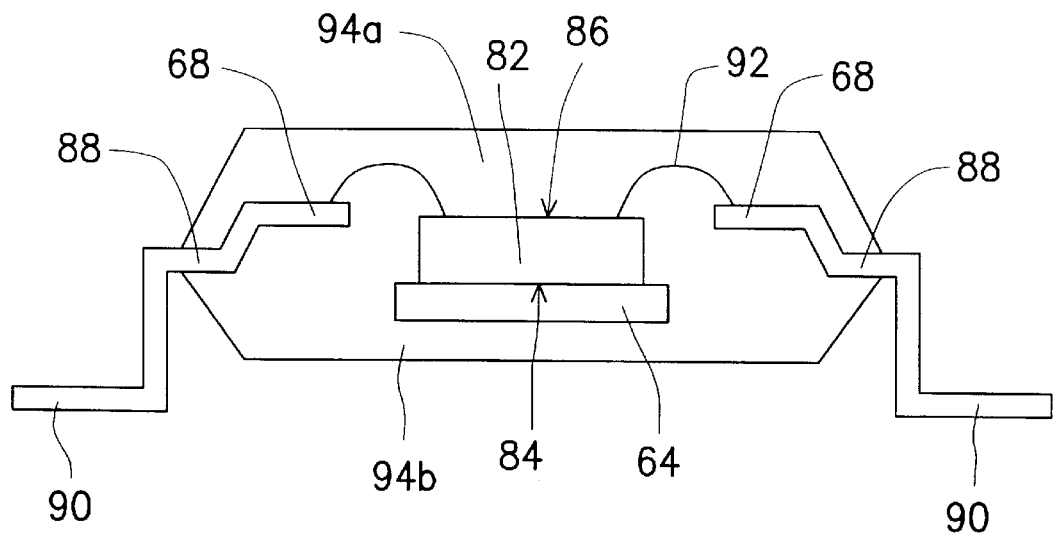
FIG. 5A is a schematic, cross-sectional view showing a semiconductor IC package using a lead frame according to the first preferred embodiment of this invention.

FIG. 5A is a warping of cross-sectional view showing a semiconductor IC package using a lead frame according to the first preferred embodiment of this invention. As shown in FIG. 5A, semiconductor package 80 uses the steel alloy lead frame 60 as shown in FIG. 4A as a silicon chip 82 carrier. The lower surface 84 of the silicon chip 82 is attached to the surface of the die pad 64.

For example, epoxy or conductive silver paste or tape is used to attach the chip 82 onto the die pad 64. The lead frame has a downset die pad 64. However, all the internal leads 68 bend upwards above the upper surface 86 of the silicon chip 82 so that the internal leads 68 are at a higher level than its lead shoulders 88. Furthermore, the internal leads 68 are electrically connected to the respective bonding pads (not shown in the figure) of the silicon chip 82 by bonding gold or aluminum conductive metallic wires 92. Finally, the silicon chip 82, the internal leads 68, the die pad 64 and the conductive metallic wires 92 are all sealed by insulating material such as epoxy resin above the lead frame 94a and below the lead frame 94b.

Hence, only the external leads 90, which lie outside the package body, are exposed. Since the packaging process for the lead frame is similar to the packaging of a conventional lead frame, detailed description is omitted here. However, it should be noted that the invention might be applied to all kinds of packages having a lead frame inside, for example, a small outline package (SOP) or a thin small outline package (TSOP). In addition, the external leads 90 can have different shapes and forms such as pin-through-hole type, gull wing or even J-shaped.

Because the lead frame 60 is made of steel alloy, the package body tends to bend upwards. By bending the internal leads 68 upwards, the required amount of insulating material 94a above the lead frame is reduced while the required amount of insulating material 94b below the lead frame is increased. Consequently, the amount of insulating material above and below the lead frame is roughly the same, and any subsequent thermal stresses can be balanced internally. Therefore, the package body warping can be reduced and product quality can be improved. Furthermore, since the improved lead frame structure permits roughly equal masses of insulating material both above and below the lead frame, the flow of molding compound during an transfer molding operation is improved, as well.

Figure 5B:
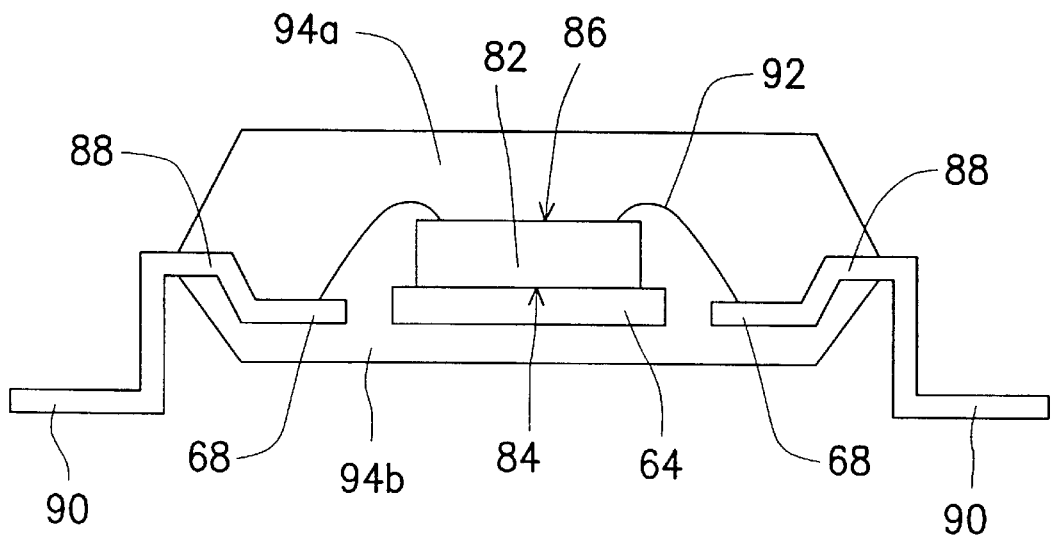
FIG. 5B is a schematic, cross-sectional view showing a semiconductor IC package using a lead frame according to the second preferred embodiment of this invention.

FIG. 5B is a cross-sectional view showing a semiconductor IC package using a lead frame according to the second preferred embodiment of this invention. As shown in FIG. 5B, semiconductor package 96 uses a copper lead frame 74 as shown in FIG. 4B as a silicon chip 82 carrier. The lower surface 84 of the silicon chip 82 is attached to the surface of the die pad 64. For example, epoxy or conductive silver paste or tape is used to attach the chip 82 onto the die pad 64. Similarly, the lead frame has a downset die pad 64. This time, all the internal leads 68 bend downwards, below the lower surface 84 of the silicon chip 82, so that the internal leads 68 are at a lower level than lead shoulders 88. Since the packaging process for the lead frame is similar to the packaging of a conventional lead frame detailed description is omitted here.

Because the lead frame 74 is made of copper, the package body tends to bend downwards. By bending the internal leads 68 downwards, the required amount of insulating material 94d below the lead frame is reduced while the required amount of insulating material 94c above the lead frame is increased. Consequently, internal stresses due to thermal expansion are balanced, and the package body warping is greatly reduced.

In summary, the advantages of using the lead frame structure in this invention includes:

1. By bending internal leads up or down, the amount of insulating material above and below the lead frame can change. Hence, thermal stresses created by the packaging can be lowered and package body warping can be prevented.

2. The special shape of the lead frame structure permits equal flow of molding compound into areas above and below the lead frame when an transfer molding operation is carried out to seal off the packaging area of the lead frame.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead frame having a plane, comprising:
    a die pad downward below the plane of the lead frame at the center of the lead frame; and
    a plurality of leads surrounding the die pad, wherein each lead comprises an internal lead, tips of the internal leads close to the die pad bend upward above the plane of the lead frame, and the die pad and the internal leads are not at the same plane.

2. The lead frame of claim 1, wherein the die pad is parallel to the lead frame.

3. The lead frame of claim 1, wherein all the tips of the internal leads together form a surface that parallels the lead frame.

4. The lead frame of claim 1, wherein the lead frame further includes side rails such that the die pad is connected to the side rails by a plurality of tie bars and the leads are connected with each other and ultimately to the side rails by a plurality of dam bars.

5. A semiconductor integrated circuit package, comprising:
    a silicon chip having a first side and a second side;
    a die pad attached to the first side of the silicon chip;
    a plurality of leads surrounding the silicon chip such that each lead includes an internal lead section, a shoulder section and an external lead section, wherein the die pad is downward below the lead shoulder section, the internal leads bend towards the second side of the silicon chip, the internal lead section, the die pad and the lead shoulder section are on different planes, and the leads are furthermore electrically connected to the silicon chip; and
    an insulating material that seals off the silicon chip, the die pad and the internal lead section of the leads.

6. The package of claim 5, wherein the leads are connected to the silicon chip by a plurality of gold wires.

7. The package of claim 5, wherein the leads are connected to the silicon chip by a plurality of metallic wires.

8. The package of claim 5, wherein the insulating material includes epoxy resin.

9. The package of claim 5, wherein the external lead section of the leads includes the pin-through-hole type.

10. The package of claim 5, wherein the external lead section of the leads includes the gull wing type.

11. The package of claim 5, wherein the external lead section of the leads includes the J-type.

12. The package of claim 5, wherein the package can be a small outline package.

13. A lead frame having a plane, comprising:
    a die pad downward below the plane of the lead frame at the center of the lead frame; and
    a plurality of leads surrounding the die pad, wherein each lead comprises an internal lead, tips of the internal leads close to the die pad also bend downward below the plane of the lead frame and the die pad and the internal leads are at the same plane.

14. The lead frame of claim 13, wherein the die pad is parallel to the lead frame.

15. The lead frame of claim 13, wherein all the tips of the internal leads together form a surface parallel to the lead frame.

16. The lead frame of claim 13, wherein the lead frame further includes side rails such that the die pad is connected to the side rails by a plurality of tie bars and the leads are connected with each other and ultimately to the side rails by a plurality of dam bars.

17. A semiconductor integrated circuit package, comprising:
    a silicon chip having a first side and a second side;
    a die pad attached to the first side of the silicon chip;
    a plurality of leads surrounding the silicon chip such that each lead includes an internal lead section, a shoulder section and an external lead section, wherein the die pad is downward below the lead shoulder section, the internal leads bend towards the first side of the silicon chip, the die pad, the internal lead section and the lead shoulder section are on different planes, and the leads are furthermore electrically connected to the silicon chip; and
    an insulating material that seals off the silicon chip, the die pad and the internal lead section of the leads.

18. The package of claim 17, wherein the leads are connected to the silicon chip by a plurality of gold wires.

19. The package of claim 17, wherein the leads are connected to the silicon chip by a plurality of aluminum wires.

20. The package of claim 17, wherein the insulating material includes epoxy resin.

21. The package of claim 17, wherein the external lead section of the leads includes the pin-through-hole type.

22. The package of claim 17, wherein the external lead section of the leads includes the gull wing type.

23. The package of claim 17, wherein the external lead section of the leads includes the J-type.

24. The package of claim 17, wherein the package can be a small outline package.

25. The lead frame of claim 1, wherein the lead frame is made of alloy.

26. The package of claim 5, wherein the die pad and the leads are made of alloy.

27. The lead frame of claim 13, wherein the lead frame is made of copper.

28. The package of claim 17, wherein the die pad and the leads are made of copper.

* * * * *